United States Patent [19]

Pai et al.

[11] Patent Number: 4,827,611
[45] Date of Patent: May 9, 1989

[54] COMPLIANT S-LEADS FOR CHIP CARRIERS

[75] Inventors: Deepak K. Pai; Michael J. Julik; Robert W. Fluhrer, all of Burnsville, Minn.

[73] Assignee: Control Data Corporation, Minneapolis, Minn.

[21] Appl. No.: 173,917

[22] Filed: Mar. 28, 1988

[51] Int. Cl.$^4$ .................. H01L 23/12; H01L 23/48
[52] U.S. Cl. ........................... 29/843; 29/854; 361/405
[58] Field of Search ............... 29/842, 843, 854, 884; 361/400, 405, 421

[56] References Cited

U.S. PATENT DOCUMENTS

| | | |
|---|---|---|
| 3,676,926 | 7/1972 | Kendall . |
| 3,769,679 | 11/1973 | Kendall . |
| 3,877,064 | 4/1975 | Scheingold . |
| 4,009,485 | 2/1977 | Koenig . |
| 4,316,321 | 2/1982 | Wickham . |
| 4,592,617 | 6/1986 | Seidler . |
| 4,640,499 | 2/1987 | Hemler . |
| 4,647,126 | 3/1987 | Sobota . |
| 4,703,393 | 10/1987 | Yamamoto . |

Primary Examiner—Howard N. Goldberg
Assistant Examiner—Taylor J. Ross
Attorney, Agent, or Firm—Robert Angus; Joseph A. Genovese

[57] ABSTRACT

A compliant S-shaped lead for resiliently supporting an integrated circuit chip package in spaced relation generally parallel to a printed circuit board. The S-lead bends and twists to absorb forces which would otherwise be exerted on solder joints due to temperature cycling and vibration. The symmetrical S-lead self-centers on both the package and PC board to provide minimum stress. The leads are held by a support strip for connection to the chip carrier. Thereafter, the support strip is removed and the carrier positions the leads for connection to the circuit board.

10 Claims, 1 Drawing Sheet

COMPLIANT S-LEADS FOR CHIP CARRIERS

BACKGROUND OF THE INVENTION

The present invention relates to electromechanical connectors for mounting integrated circuit packages to printed wire boards (PWB). More particularly, the invention relates to a resilient support for supporting an integrated circuit chip on a printed circuit board and interconnecting electrical circuits on a chip with circuits on the board.

Heretofore, leadless ceramic chip carriers (LCC's) that are exposed to harsh thermal cyclic environments and vibration exhibit a high failure rate. LCC reliability problems originate from LCC solder joint degradation and cracking that occurs over time from exposure to thermal cyclic environments and vibration. Further, failures develop as LCC solder joints undergo repeated stresses and strains induced by temperature cycling. Accumulated cyclic stresses and strains damage LCC solder joints, eventually leading to solder joint degradation and cracking. Ultimately, the failed solder joint connections cause electrical failures in the electronic system. As a result, there is a need for a compliant electrical interface between leadless chip carriers and printed circuit boards which is suitable for mass production using current surface mount technology.

The compliant S-leads of the present invention serve as an electrically conductive as well as a thermally conductive path between the LCC and the substrate. The S-leads serve as a mechanically compliant LCC to PWB substrate interface that withstands the damaging solder joint thermal stresses and vibration.

SUMMARY OF THE INVENTION

According to the present invention, a plurality of S-leads are mounted to a support strip. One leg of each leg has a head having tangs supporting a solder bead. The opposite leg is supported by the support strip in break-away fashion; the support strip maintaining the heads in alignment with the pattern of contacts on the chip carrier. The legs of the leads are substantially parallel and the heads are mounted to the carrier substantially free of stress. The leads provide a compliant electrical and mechanical connection between the chip carrier and circuit board.

One feature of the invention resides in the method of mounting the chip carrier to the board that the support strip aligns the leads for mounting to the carrier. The support strip is then removed and the carrier aligns the leads for mounting to the board.

DETAIL DESCRIPTION OF THE INVENTION

Figure 1:
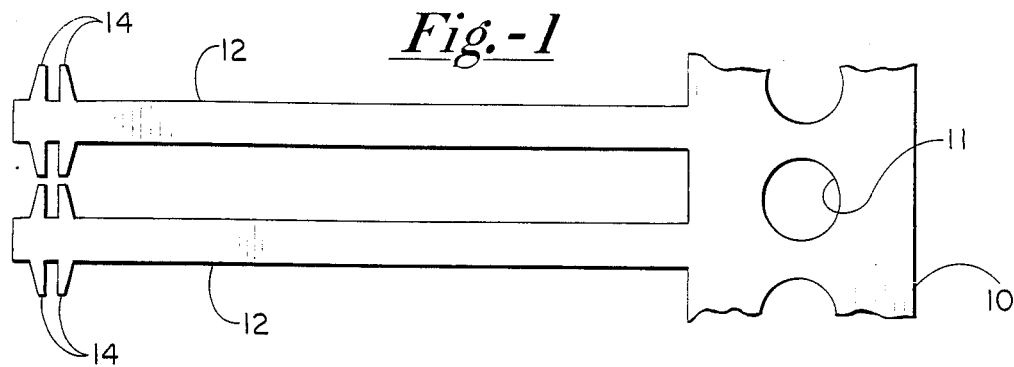
FIG. 1 is a top view of compliant lead members attached to a support strip of metal from which the lead members are formed.
Figure 2:
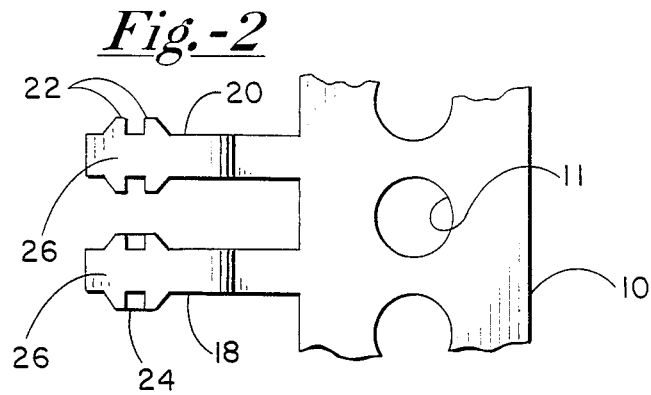
FIG. 2 is a top view, as in FIG. 1, of the formed S-leads attached to the support strip.
Figure 3:
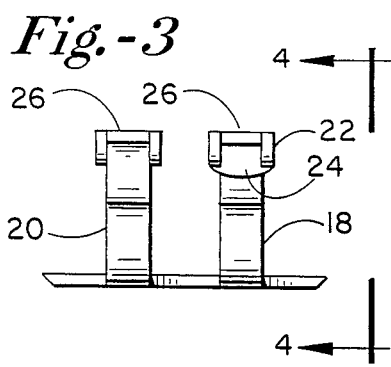
FIG. 3 is a front view of the assembly illustrated in FIG. 2.
Figure 4:
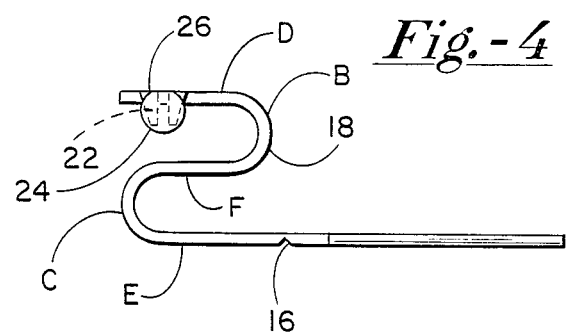
FIG. 4 is a sectional view taken along the line 4—4 of FIG. 3 and illustrating an embodiment of a single compliant S-lead still attached to the support strip.

Compliant S-leads constructed in accordance with the present invention are preferably manufactured in ganged assemblies. An elongated strip of flat metal is progressively fed into a machine which removes material from the strip so that there remains a narrower support strip 10 shown in FIG. 1 having spaced flat fingers 12 and extensions 14 extending therefrom. Each of the fingers is scored at point 16 to facilitate subsequent separation. As shown in FIGS. 2-4, the portion of each finger beyond its score line 16 is bent or formed into the desired S-shape members 18 and 20. Extensions 14 are bent to form tangs 22, with individual tangs 16 are bent from head 26. The result is a strip of ganged compliant S-leads 18, 20, each having a substantially uniform width and thickness. Score line 16 is interposed between the leads and the support strip 10. The strip 10 may be severed between any two fingers to obtain gang assemblies containing a desired number of S-leads. Perforations 11 are provided in strip 10 to facilitate severing. The support strip 10 holds the leads in spaced relation conforming to the contacts on an LCC. A solder bead 24 is held by tangs 22, bead 24 being shown only in connection with lead 18 for clarity purposes. In accordance with the present invention, the lead members 18,20 are bent at points B and C to form three substantially flat portions parallel leg portions D, E, and F. Portion F absorbs mechanical stress and shock. The S-shape is formed so that two flat members shown as D and E along the top and bottom of the S-shaped member respectively, form flat parallel contacts between a chip carrier and a printed circuit board. Flat portion D forms head 26 for each S-lead, each head having the downwardly depending tangs 22 supporting solder 24.

Figure 5:
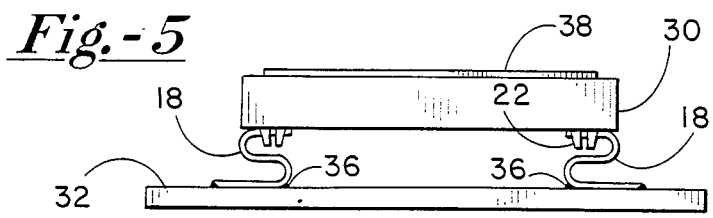
FIG. 5 illustrates the manner in which a chip carrier is mounted on printed wiring board using a plurality of compliant S-leads.

In FIG. 5, a miniaturized assembly such a leadless chip carrier 30 containing an integrated circuit is shown mounted on a plated wire board substrate 32 using the novel S-shape lead of the present invention. The mounting is accomplished as follows. One edge of the IC package is held in close relationship to the strip of S-leads which are still ganged together by support strip 10 as illustrated in FIGS. 1 and 2. The support strip 10 maintains the heads 26 in a predetermined alignment to match the pattern of contacts 34 on carrier 30. The leads are then soldered to the contacts 32 of the chip carrier using surface mount or other solder technique. The solder bead 24 wets and mates with the electrical contact of the leadless ceramic chip carrier. The carrier self-centers on the leads in self-alignment, the flat chip carrier and the flat portion D of the S-lead making an intimate mechanical and electrical connection. After each lead is attached by solder 24, the leads are broken from strip 10 along score line 16 and the support strip 10 is discarded. What remains is a plurality of individual leads 18 soldered to a supporting surface of the leadless chip carrier 30 as shown in FIG. 5.

After the compliant S-leads are attached to the leadless chip carrier, a second operation is necessary to attach the leadless chip carrier now having compliant S-leads to the printed circuit board 32. The carrier 30 now maintains the legs E of the leads in alignment to match the pattern of contacts on board 32. The standard techniques of printed circuit boards is used. The PWB having plated electrical connections is dipped in solder. The solder wets to the board forming areas for mounting of LCCs. The LCC with S-leads is placed over the pads of the PCB and with process of surface mount technology the solder is reflowed. As shown in FIG. 5, the board 32 forms a solder joint at 36 with the S-leads of the present invention. A large flat area corresponding to E of the compliant S-lead mates directly with the board 32 forming a mechanical and electrical connection thereto.

The compliant S-lead of the present invention can be quite small and permits high packing density. By way of example and not limitation, the width of each S-lead may be 0.020 inch wide with a spacing of 0.025 inch between leads. The height of the S-lead can be on the orderof seventy-thousandths of an inch or less, the overall length of the lead being seventy-thousandths of an inch. The S-lead may be formed from beryllium copper 0.005 inch thick, which provides the proper springiness and heat transfer characteristics necessary for packaging of the ICs. The entire S-lead is to be solder plated with 60/40 or other tin-lead solder.

A primary advantage of the compliant S-lead is that its use reduces solder joint stress and compensates for the different coefficients of expansion of the chip carrier 30 and PWB 32. Referring to FIG. 5, a temperature change will cause an expansion or contraction of LCC 30 and PWB 32 along the dimensions seen in the figure, the expansion or contraction being different for the carrier, usually ceramic and the board. At the same time there is an expansion or contraction of the LCC and the PWB along the dimension which is into the figure. As a result, rotational shear forces are applied to the solder joint 24 and 36 at the surfaces of the carrier and printed wire board. The S-shaped construction of the compliant S-lead absorbs much of the force which would otherwise be applied to the solder joints. Particularly, as the LCC 30 moves relative to the PC board, the S-shaped member of each compliant lead twists to absorb some of the force. In FIG. 5, the twisting movement of each S-shaped member takes place primarily between and including the bends B and C. The two halves of the S-shaped member working in similar manner to absorb stresses which result from warpage of the PC board 32. A further advantage of the compliant S-lead is that it permits higher packing density of components. As shown in FIGS. 2-4, there are no bends in the leads which extend laterally past the plane of the lead. That is, all bends align in a single plane. Furthermore, there are no appendages laterally of a lead. From inspection of FIG. 3, it is evident that during the manufacturing process, the leads may be more closely spaced than if the leads had appendages extending laterally thereof.

During both the solder processes, the compliant S-lead is allowed to self-center and reposition itself to be as stress-free as possible. There is no clamping connection of the lead to either the IC package or the printed circuit (wire) board.

The compliant S-lead of the present invention works with various size packages. It does not have to clip onto an IC package having a specified thickness or clip over and possibly short out covers 38 of IC packages shown in FIG. 5.

The compliant S-lead of the present invention has been demonstrated to be rugged and able to withstand thermal cycling which is the main cause of failure. The novel S-leads provide a package capable of maintaining mechanical and electrical reliability during random vibration.

While the connectors have been described as employing tangs supporting a solder bead for connection to the chip carrier, it is evident that the legs D and E could be plated with solder for connection to the chip carriers and/or board, or that the leads could be brazed to the chip carrier.

Figure 6:
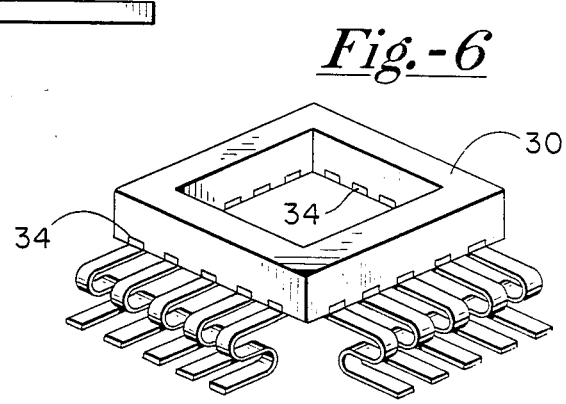
FIG. 6 is a perspective view of the assembly shown in FIG. 5 with a portion removed.

S-leads according to the present invention may be applied to the ceramic chip carrier before the insertion of integrated circuit therein. Therefore the S-leads could be attached at temperatures or in an environment that an integrated circuit could not withstand. The materials and the design of the present invention is readily adapted to brazing of the compliant S-leads onto the leadless ceramic chip carrier at temperatures up to 900° C. prior to the insertion of an integrated circuit. The brazing can also be accomplished by a high temperature alloying of the lead to the ceramic carrier by laser heating or other means. Such a package is shown in FIG. 6 wherein the compliant S-leads are already attached mechanically and electrically to a ceramic chip carrier.

This invention is not to be limited by the embodiment sown in the drawings and described in the description, which is given by way of example and not of limitation, but only in accordance with the scope of the appended claims.

What is claimed is:

1. A connector system for resiliently attaching an integrated circuit chip in substantially spaced, parallel relation to a surface of a circuit board and for establishing electrical connection between circuits on the chip and circuits on the board, said connector system comprising a unitary member comprising a support strip and a plurality of S-leads supported by said support strip in predetermined spaced relation so sized and arranged as to mate with individual first contacts associated with said chip, each of said S-leads comprising:
   (a) a single piece of conductive material having uniform thickness throughout its length, said piece of material being shaped to form an S-shaped body having first, second and third substantially flat, parallel legs with a first curve portion between the first and second leg and a second curve portion between the second and third legs, the third leg being joined to said support strip, and
   (b) a head portion formed in the first leg, said head portion having depending tangs supporting a solder bead, whereby the head portion may be secured to a respective first contact with said solder; said support strip securing the S-leads so that the head portions of the S-leads are aligned for connection to the first contacts associated with said chip whereby the head portions may be secured to the first contacts, said support strip being removable from said S-leads so that the third legs may be mounted to individual second contacts on said circuit board, whereupon said S-leads mount said chip to said board in a generally flat arrangement free of stress and provides a compliant electrical and mechanical connection between the chip and the board.

2. Apparatus according to claim 1 wherein said chip is carried by a chip carrier and said first contacts are supported by said carrier.

3. A connector system for resiliently attaching an integrated circuit chip in substantially spaced, parallel relation to a surface of a circuit board and for establishing electrical connection between circuits on the chip and circuits on the board, said connector system comprising a unitary member comprising a support strip and a plurality of S-leads supported by said support strip in predetermined spaced relation so sized and arranged as to mate with individual first contacts associated with said chip, each of said S-leads comprising:

(a) a single piece of conductive material having uniform thickness throughout its length, said piece of material being shaped to form an S-shaped body having first, second and third substantially flat, parallel legs with a first curve portion between the first and second leg and a second curve portion between the second and third legs, the third leg being joined to said support strip, the third leg being scored at the junction to the support strip, and (b) a head portion formed in the first leg;

said support strip securing the S-leads so that the head portions of the S-leads are aligned for connection to the first contacts associated with said chip whereby the head portions may be secured to the first contacts, said support strip being arranged to be broken at said score from said S-leads so that the third legs may be mounted to individual second contacts on said circuit board, whereupon said S-leads mount said chip to said board in a generally flat arrangement free of stress and provides a compliant electrical and mechanical connection between the chip and the board.

4. Apparatus according to claim 3 wherein said head portions have depending tangs supporting a solder bead, whereby the head portions may be secured to the first contacts with said solder.

5. Apparatus according to claim 3 wherein said chip is carried by a chip carrier and said first contacts are supported by said carrier.

6. Apparatus according to claim 5 wherein said head portions have depending tangs supporting a solder bead, whereby the head portions may be secured to the first contacts with said solder.

7. The method of electrically and mechanically connecting an integrated chip carrier to a circuit board, said carrier having a plurality of individual first contacts arranged in a first pattern and said circuit board having a plurality of individual second contacts arranged in a second pattern, said method comprising:

(a) providing a connector system having a support strip supporting a plurality of S-leads, said S-leads each having an S-shaped body having first, second, and third substantially flat, parallel legs with a first curve portion between the first and second legs and a second curve portion between the second and third legs, said first legs each supporting a head, said third legs being removably fastened to said support strip to arrange said heads in said first pattern to mate with said first contacts, (b) connecting said heads to individual first contacts while positioning the heads with said support strip, (c) after step (b), removing said support strip from said S-leads, said third legs being supported in said second pattern by the chip carrier and the connection of the S-leads thereto, and (d) after step (c), connecting said third legs to the individual second contacts.

8. The process according to claim 7 further including, after step (b), supporting a circuit chip with said carrier.

9. The process according to claim 8 wherein the heads are connected to said first contacts by brazing.

10. The process according to claim 7 wherein the heads have depending tangs supporting a solder bead and the heads are connected to the first contacts with said solder.

* * * * *